United States Patent

Iwabuchi

(10) Patent No.: US 7,071,527 B2
(45) Date of Patent: Jul. 4, 2006

(54) SEMICONDUCTOR ELEMENT AND MANUFACTURING METHOD THEREOF

(75) Inventor: Akio Iwabuchi, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/511,741

(22) PCT Filed: Apr. 25, 2003

(86) PCT No.: PCT/JP03/05334

§ 371 (c)(1),
(2), (4) Date: Oct. 18, 2004

(87) PCT Pub. No.: WO03/092078

PCT Pub. Date: Nov. 6, 2003

(65) Prior Publication Data

US 2005/0212073 A1 Sep. 29, 2005

(30) Foreign Application Priority Data

Apr. 25, 2002 (JP) .............................. 2002-123615

(51) Int. Cl.
*H01L 23/58* (2006.01)
*H01L 29/76* (2006.01)
*H01L 39/94* (2006.01)
*H01L 31/062* (2006.01)
*H01L 31/113* (2006.01)

(52) U.S. Cl. ...................... 257/492; 257/493; 257/339; 257/343; 257/509; 257/512; 257/E27.064; 257/E21.63

(58) Field of Classification Search ................. 257/343, 257/509, 492–493, 27.064, 21.63
See application file for complete search history.

(56) References Cited

U.S. PATENT DOCUMENTS

| 4,866,495 | A | | 9/1989 | Kinzer |
| 5,512,769 | A | | 4/1996 | Yamamoto |
| 5,686,754 | A | | 11/1997 | Choi et al. |
| 5,801,431 | A | | 9/1998 | Ranjan |
| 6,507,085 | B1 | * | 1/2003 | Shimizu ...................... 257/502 |
| 6,642,599 | B1 | * | 11/2003 | Watabe et al. ............... 257/509 |
| 6,680,515 | B1 | * | 1/2004 | Hsing .......................... 257/409 |
| 6,693,308 | B1 | * | 2/2004 | Sankin et al. ................ 257/103 |
| 6,900,091 | B1 | * | 5/2005 | Williams et al. ............. 438/228 |
| 2003/0228721 | A1 | * | 12/2003 | Efland et al. ................ 438/140 |
| 2005/0104124 | A1 | * | 5/2005 | Iwabuchi ..................... 257/343 |

FOREIGN PATENT DOCUMENTS

| JP | 53-045978 | 4/1978 |
| JP | 02-218153 | 8/1990 |

* cited by examiner

*Primary Examiner*—Kenneth Parker
*Assistant Examiner*—Jesse A. Fenty
(74) *Attorney, Agent, or Firm*—Howard & Howard

(57) ABSTRACT

A p-channel MOSFET (1) includes a semiconductor substrate (2), an epitaxial region (3), a second diffusion region (6), and a drain region. The epitaxial region (3) is formed on the upper surface of the semiconductor substrate (2). The second diffusion region (6) is formed in a predetermined upper surface area of the epitaxial region (3). The second diffusion region (6) has a central portion (6a) and a peripheral portion (6b). The central portion (6a) is formed substantially at the center of the epitaxial region (3) and formed thicker than the peripheral portion (6b). The peripheral portion (6b) is formed in an annular shape so as to surround the central portion (6a). The drain region (7) is formed in an upper surface area of the central portion (6a) of the second diffusion region (6).

5 Claims, 3 Drawing Sheets

SEMICONDUCTOR ELEMENT AND MANUFACTURING METHOD THEREOF

This application is a 371 of PCT/JP03/05334, filed Apr. 25, 2003.

1. Technical Field

The present invention relates to a semiconductor element, and particularly relates to a semiconductor element having a structure called RESURF structure and a manufacturing method thereof.

2. Background Art

As a semiconductor element mounted on an Integrated Circuit, there is a p-channel MOSFET (Metal Oxide Semiconductor Field Effect Transistor) having a structure called RESURF structure. FIG. 3 shows one example of this kind of p-channel MOSFET.

A p-channel MOSFET 101 (hereinafter referred to as MOSFET 101) comprises a p⁻ type semiconductor substrate 102, an n⁻ type epitaxial region 103 formed on the upper surface of the semiconductor substrate 102 by an epitaxial growth method or the like, and p⁺ type isolation regions 104 for isolating each MOSFET 101 to be mounted on an integrated circuit, by utilizing a reverse bias of p-n junction.

Further, the MOSFET 101 comprises p⁻ type diffusion regions 105 formed in an upper surface area of the epitaxial region 103, and p⁺ type drain regions 106 formed in the upper surface area of the epitaxial region 103 so as to contact the diffusion regions 105.

Furthermore, the MOSFET 101 comprises, when it is seen cross-sectionally, p⁺ type source regions 107 formed in the surface area of the epitaxial region 103 between the diffusion regions 105, and an n⁺ type back gate region 108 formed in the surface area of the epitaxial region 103 so as to be sandwiched by the source regions 107.

Gate insulation films 109 are formed on the upper surface of the epitaxial region 103 between the diffusion region 105 and the source region 107. Gate electrodes 110 are formed on the gate insulation films 109. Of the surface area of the epitaxial region 103, surface areas facing the gate electrodes 110 via the gate insulation films 109 function as channel regions.

Drain electrodes 111, source electrodes 112, a back gate electrode 113, and ground electrodes 114 to be grounded are formed on the upper surfaces of the drain regions 106, the upper surfaces of the source regions 107, the upper surface of the back gate region 108, and the upper surfaces of the isolation regions 104, respectively. Of the upper surface of the MOSFET 101, surfaces other than the surfaces on which the gate insulation film 109, the gate electrodes 110, the drain electrodes 111, the source electrodes 112, the back gate electrode 113, and the ground electrodes 114 are formed are covered with a field oxide film 115.

As described above, the MOSFET 101 has a so-called double RESURF structure in which the n⁻ type epitaxial region 103 is formed on the p⁻ type semiconductor substrate 102, and the p⁻ type diffusion regions 105 are formed in the surface area of the epitaxial region 103.

The MOSFET 101 having the double RESURF structure has its epitaxial region 103 and diffusion region 105 substantially depleted, when a voltage of equal to or greater than predetermined value is applied to between the source electrode 112 and the drain electrode 111. Due to this, the potential is fixed and the electric field density per unit area of the epitaxial region 103 is reduced. As a result, effects such as improvement in voltage withstandability can be obtained.

The MOSFET 101, which utilizes the high voltage withstandability due to the (double) RESURF structure, has a variety of uses, and may be used in a level-shift down circuit. In a case where used in a level-shift down circuit, the MOSFET 101 is required to have a voltage withstandability that is enough to withstand a drain voltage higher by ten plus several volts than a voltage of the semiconductor substrate 102. The MOSFET 101 having the above-described structure can easily adapt to such a request.

However, in a case where used for a purpose which requires a voltage withstandability enough to withstand a further higher voltage level, the MOSFET 101 having the above-described structure cannot adapt to a situation where the drain voltage changes from a ground level to a higher voltage level.

In the MOSFET 101, the isolation regions 104 at a ground level are formed near the drain regions 106 in order to maintain the balance of electric charges near the drain regions 106 good. However, with this structure, the electric field strength between the drain region 106 and the isolation region 104 rises in a case where the voltage level of the drain voltage changes to a higher level in a plus direction with respect to the ground level, and there might be caused a punch through or a breakdown at a voltage level lower than a desired voltage level.

The present invention was made in view of the above circumstance, and an object of the present invention is to provide a semiconductor element having an excellent high voltage withstandability and a manufacturing method thereof.

Another object of the present invention is to provide a semiconductor element in which a punch through or an undesirable breakdown is not easily caused, and a manufacturing method thereof.

DISCLOSURE OF INVENTION

To achieve the above objects, a semiconductor element according to a first aspect of the present invention comprises: a first semiconductor region (2) of a first conductive type; a second semiconductor region (3) of a second conductive type which is formed on one principal surface of the first semiconductor region; a third semiconductor region (6) of a first conductive type which is formed in a predetermined surface area of the second semiconductor region (3); a fourth semiconductor region (7) of a first conductive type which is formed in a surface area of the third semiconductor region (6) and has a higher impurity concentration than the third semiconductor region has; and a fifth semiconductor region (8) which is formed in a surface area of the second semiconductor region (3) so as to surround the third semiconductor region (6), wherein: the third semiconductor region (6) has a central portion (6a) which surrounds the fourth semiconductor region, and a peripheral portion (6b) which surrounds the central portion (6a); the central portion (6a) is formed to have a depth from a surface of the second semiconductor region (3) that is deeper than that of the peripheral portion (6b); and a part of the second semiconductor region (3) arranged right under the central portion (6a) has a smaller amount of electric charges than an amount of electric charges of a part of the second semiconductor region (3) arranged right under the peripheral portion (6b), because the part of the second semiconductor region (3) arranged right under the central portion (6a) has a thickness thinner than that of the part of the second semiconductor region (3) arranged right under the peripheral portion (6b).

In the semiconductor element having such a structure, the first semiconductor region, the second semiconductor region, and the fourth semiconductor region form a RESURF structure. Due to this, electric field relaxation in the horizontal direction of the semiconductor element is favorably achieved and effects such as improvement in the voltage withstandability can be obtained. Further, in the semiconductor element having such a structure where a part of the second semiconductor region right under the central portion is formed relatively thin, the amount of electric charges possessed by the part of the second semiconductor region right under the central portion is relatively small. Due to this, even when a voltage of a ground level is applied to the fourth semiconductor region, the electric charge balance near the fourth semiconductor region is prevented from being destroyed. Further, a part of the second semiconductor region arranged right under the peripheral portion is formed relatively thick. This thickness provides the part of the second semiconductor region arranged right under the peripheral portion with a sufficient amount of electric charges for preventing occurrence of a punch through or the like when a voltage of a relatively high voltage level is applied to the fourth semiconductor region. Accordingly, the semiconductor element of the present invention can adapt to every situation in which the voltage applied to the fourth semiconductor region changes from the ground level to a higher level, and thus can obtain under every situation, the effect of improving the voltage withstandability due to the possession of the RESURF structure.

The semiconductor element may further comprise: a drain electrode (12) formed on the fourth semiconductor region (7); a source electrode (13) formed on the fifth semiconductor region (8); a gate insulation film (10) covering the second semiconductor region (3) between the third semiconductor region (6) and the fifth semiconductor region; and a gate electrode (11) formed on the gate insulation film (10).

The semiconductor element may further comprise: an isolation region (4) of a first conductive type which is formed at an outer edge of the second semiconductor region (3); and a sixth semiconductor region (5) which is formed in a surface area of the second semiconductor region (3) so as to contact the isolation region (4), the part of the second semiconductor region (3) which is present right under the sixth semiconductor region (5) may have almost a same thickness as that of the part of the second semiconductor region (3) which is present right under the peripheral portion (6b).

The third semiconductor region (6) may be formed at generally the center of the surface of the second semiconductor region (3), and the fourth semiconductor region (7) may be formed at generally the center of the surface of the third semiconductor region (6).

The semiconductor element may further comprise a ground electrode (15) which is formed on the isolation region (4), and the second semiconductor region (3) and the third semiconductor region (6) may be substantially depleted when a voltage of a predetermined level is applied to between the gate electrode (10) and the drain electrode (12) and the ground electrode (15) is grounded.

The part of second semiconductor region (3) right under the central portion (6a) may have such an amount of electric charges as to maintain an electric charge balance near the fourth semiconductor region (7) in a case where a voltage level of a voltage applied to the fourth semiconductor region (7) is a ground level, and the part of the second semiconductor region (3) right under the peripheral portion (6b) may have such an amount of electric charges as to maintain an electric charge balance near the fourth semiconductor region (7) in a case where a voltage level of a voltage applied to the fourth semiconductor region (7) is a high level in a plus direction with respect to the ground level.

To achieve the above objects, a manufacturing method of a semiconductor element according to a second aspect of the present invention comprises: a step of forming a second semiconductor region (3) of a second conductive type on a semiconductor substrate (2) which constitutes a first semiconductor region of a first conductive type; a step of forming in a surface area of the second semiconductor region (3), a third semiconductor region (6) of a first conductive type which includes a central portion (6a) and a peripheral portion (6b) having different depths from each other, wherein the central portion (6a) is formed in a predetermined surface area of the second semiconductor region (3), and the peripheral portion (6b) is formed in a surface area of the second semiconductor region (3) so as to abut on the central portion (6a) and surround the central portion (6a) and to have a depth shallower than the depth of the central portion (6a); and a step of forming a fourth semiconductor region (7) of a first conductive type having a higher impurity concentration than the third semiconductor region (6) has, in a surface region of the central portion (6a) included in the third semiconductor region (6).

In a semiconductor element manufactured by such a manufacturing method, the first semiconductor region, the second semiconductor region, and the fourth semiconductor region form a RESURF structure. Due to this, electric field relaxation in the horizontal direction of the semiconductor element is favorably achieved, and effects such as improvement in the voltage withstandability can be obtained. Further, since the central portion is formed deeper than the peripheral portion, the part of the second semiconductor region right under the central portion is thinner than the part of the second semiconductor region right under the peripheral portion. Accordingly, the part of the second semiconductor region right under the central portion has a relatively small amount of electric charges while the part of the second semiconductor region right under the peripheral portion has a relatively large amount of electric charges. Due to this, this semiconductor element can prevent the electric charge balance near the fourth semiconductor region from being destroyed under every situation in which the voltage applied to the fourth semiconductor region changes from the ground level to a high level. As a result, this semiconductor element can obtain under every situation, the effect of improving the voltage withstandability due to the possession of the RESURF structure.

BEST MODE FOR CARRYING OUT THE INVENTION

A semiconductor element according to an embodiment of the present invention will now be specifically explained with reference to FIG. 1 and FIG. 2, by employing a p-channel MOSFET (Metal Oxide Semiconductor Field Effect Transistor) to be mounted on an integrated circuit as an example.

Figure 1:
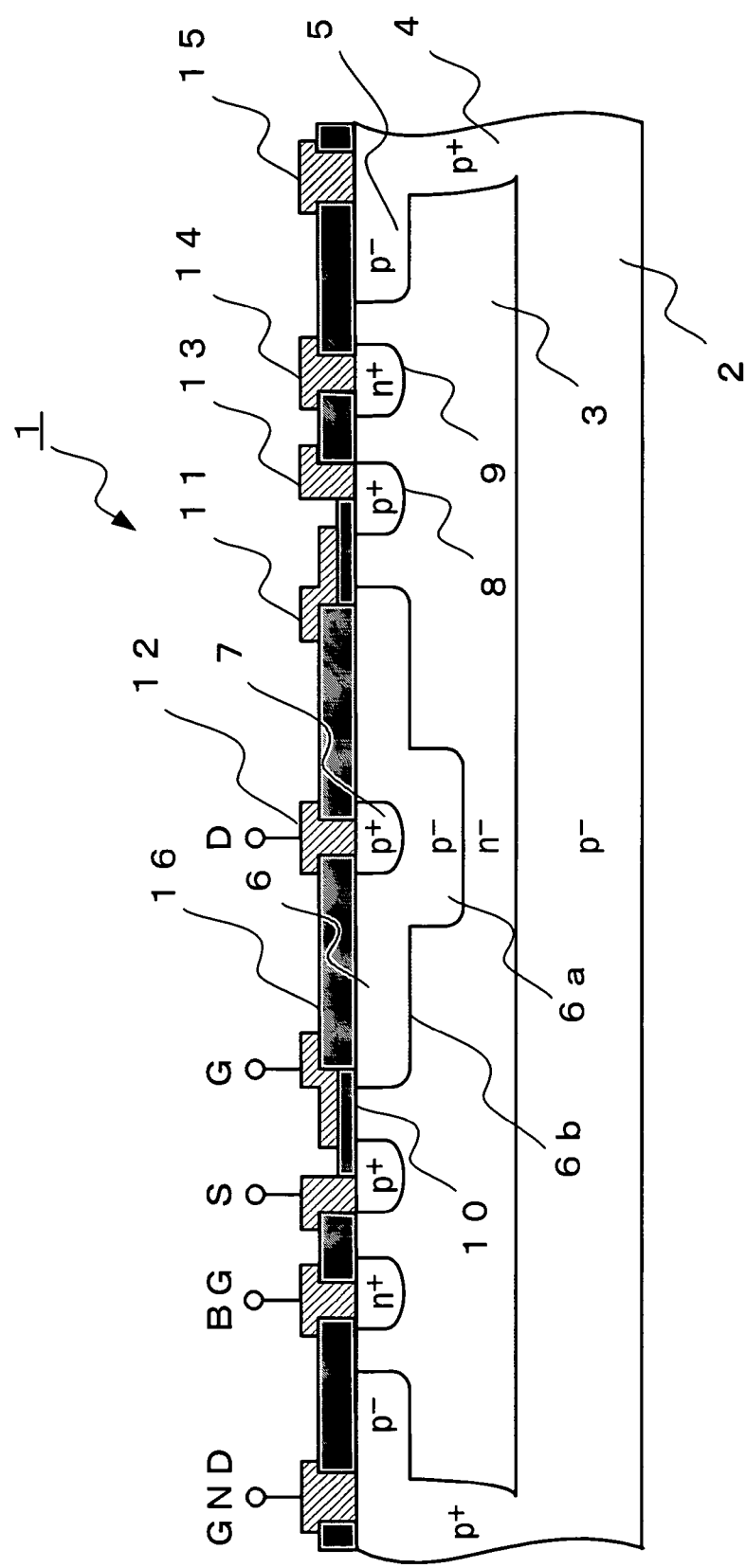
FIG. 1 is a cross sectional view showing a structure of a p-channel MOSFET according to an embodiment of the present invention.

As shown in FIG. 1, a p-channel MOSFET 1 (hereinafter referred to as MOSFET 1) comprises a semiconductor substrate 2, an epitaxial region 3, an isolation region 4, a first diffusion region 5, a second diffusion region 6, a drain region 7, a source region 8, and a back gate region 9. Further, the MOSFET 1 comprises a gate insulation film 10, a gate electrode 11, a drain electrode 12, a source electrode 13, a back gate electrode 14, a ground electrode 15, and a field insulation film 16. Explanation will be made below with reference to FIG. 1, unless a drawing number is otherwise specified.

The semiconductor substrate 2 is constituted by a first conductive type, for example, a p⁻ type semiconductor substrate.

The epitaxial region 3 is constituted by a second conductive type, for example, an n⁻ type semiconductor region which is formed on one (upper) principal surface of the semiconductor substrate 2 by an epitaxial growth method. The epitaxial region 3 functions as a drain region through which a drain current flows in a horizontal direction of FIG. 1.

The isolation region 4 is constituted by a p⁺ type semiconductor region which is formed by diffusing a p-type impurity into a predetermined region of the epitaxial region 3. The isolation region 4 has an annular shape that surrounds the epitaxial region 3. The isolation region 4 isolates each MOSFET 1 mounted on an integrated circuit, by utilizing a reverse bias of p-n junction.

The first diffusion region 5 is constituted by a p⁻ type semiconductor region which is formed by diffusing a p-type impurity into the surface area of the outer edge of the epitaxial region 3. The first diffusion region 5 is formed so as to contact the isolation region 4, and is formed so as to extend from the isolation region 4 toward the center of the epitaxial region 3, when seen cross-sectionally. As shown in FIG. 2, the first diffusion region 5 has an annular shape that surrounds the outer edge of the epitaxial region 3, when seen from above the MOSFET 1.

Figure 2:
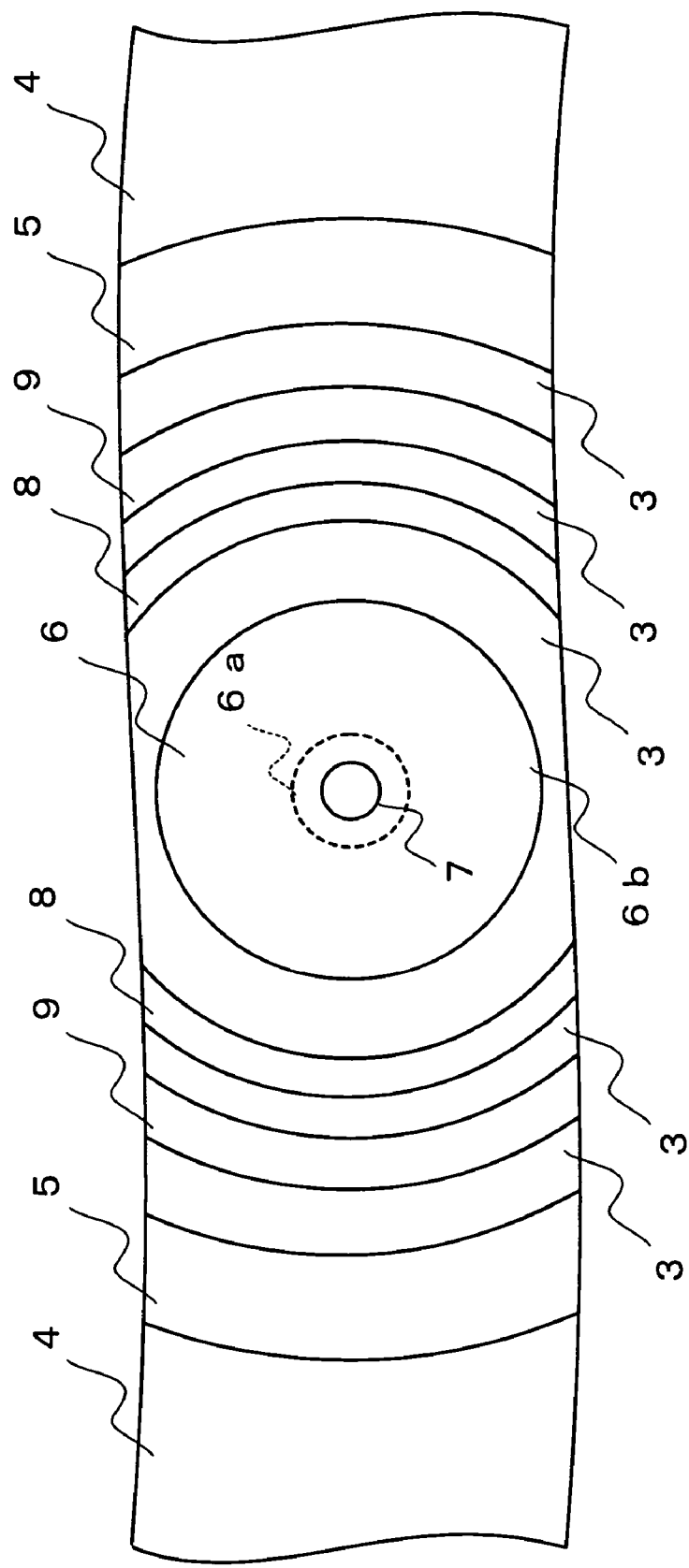
FIG. 2 is a plan view of the p-channel MOSFET of FIG. 1.
Figure 3:
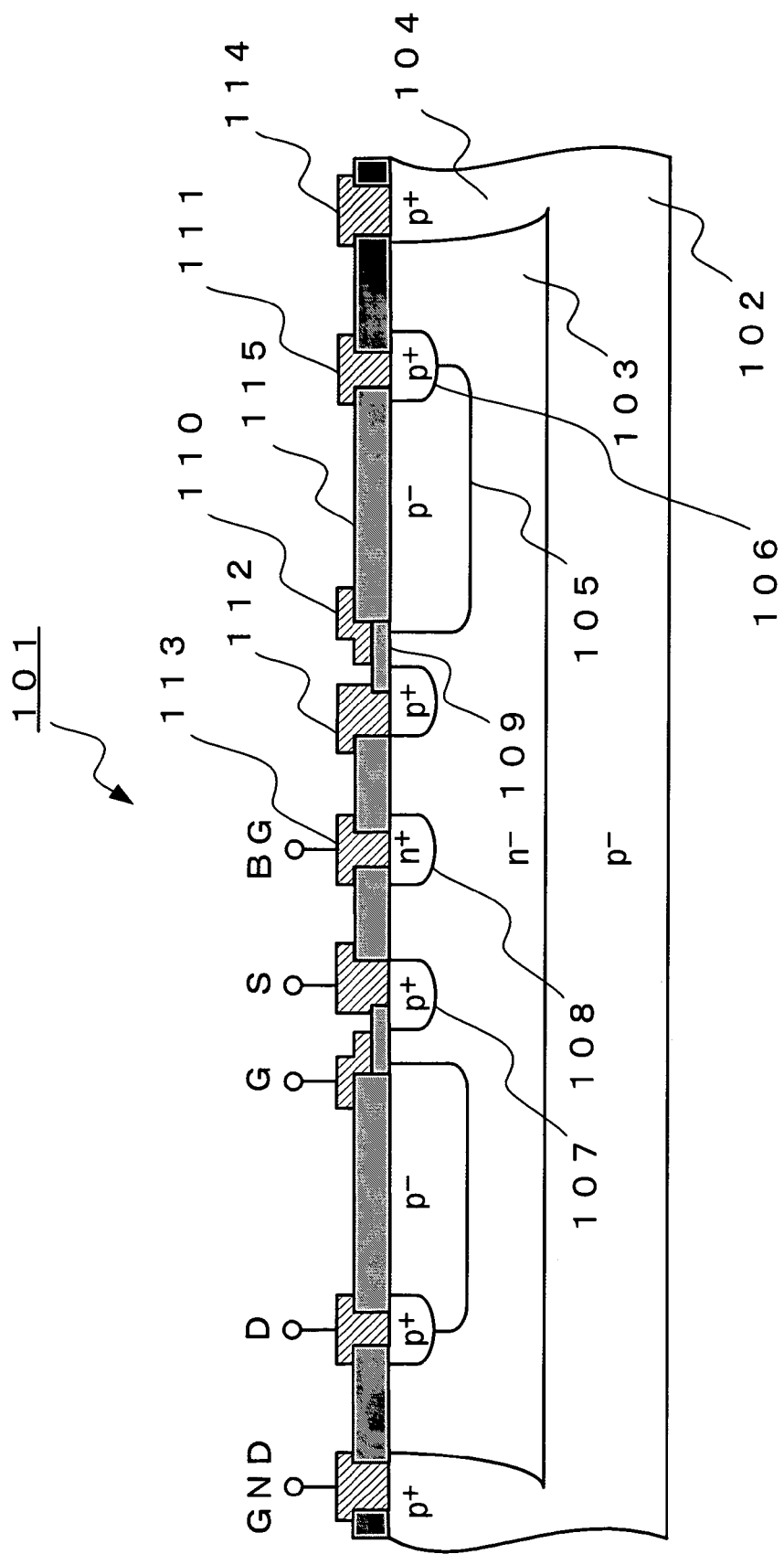
FIG. 3 is a cross sectional view showing one example of a structure of a conventional p-channel MOSFET.

In FIG. 2, the gate insulation film 10, the gate electrode 11, the drain electrode 12, the source electrode 13, the back gate electrode 14, the ground electrode 15, and the field insulation film 16 are omitted to make the structure of the first diffusion region 5, etc. easier to understand.

The second diffusion region 6 is constituted by a p⁻ type semiconductor region which is formed by diffusing a p-type impurity into generally the center portion of the surface area of the epitaxial region 3. When seen cross-sectionally, the second diffusion region 6 comprises a central portion 6a and a peripheral portion 6b which are different in depth.

The central portion 6a is formed thicker than the peripheral portion 6b. As shown in FIG. 2, the central portion 6a is formed at generally the center portion of the MOSFET 1 when seen from above the MOSFET 1.

The peripheral portion 6b is formed to have almost the same thickness as that of the first diffusion region 5. As shown in FIG. 2, the peripheral portion 6b is formed into an annular shape so as to surround the central portion 6a (or outer edge thereof).

The epitaxial region 3 intervenes between the second diffusion region 6 and the semiconductor substrate 2. The epitaxial region 3 is relatively thin right under the central portion 6a and is relatively thick right under the peripheral portion 6b, due to the difference in thickness between the central region 6a and the peripheral region 6b. The thickness of the epitaxial region 3 present right under the peripheral portion 6b is almost the same as the thickness of the epitaxial region 3 present right under the first diffusion region 5.

The drain region 7 is constituted by a p⁺ type semiconductor region which is formed by diffusing a p-type impurity into the surface area of the second diffusion region 6. (central portion 6a) and which has a higher p-type impurity concentration than that of the second diffusion region 6. As shown in FIG. 2, the drain region 7 is formed at almost the center of the second diffusion region 6. As shown in FIG. 1, the central portion 6a is present right under the drain region 7, and this central portion 6a functions as a drain-drift region.

The source region 8 is constituted by a p⁺ type semiconductor region which is formed by diffusing a p-type impurity into the upper surface area of the epitaxial region 3. As shown in FIG. 2, the source region 8 has an annular shape that surrounds the second diffusion region 6 (peripheral portion 6b) via the epitaxial region 3.

The back gate region 9 is constituted by an n⁺ type semiconductor region which is formed by diffusing an n-type impurity into the surface area of the epitaxial region 3 and hose n-type impurity concentration is higher than the n-type impurity concentration of the epitaxial region 3. As shown in FIG. 2, the back gate region 9 has an annular shape that surrounds the source region 8 via the epitaxial region 3.

The gate insulation film 10 is constituted by a silicon oxide film or the like. The gate insulation film 10 is formed so as to cover the upper surface of the epitaxial region 3 that is sandwiched by the second diffusion region 6 and the source region 8, and a part of the upper surface of the source region 8.

The gate electrode 11 is constituted by a conductive film made of polysilicon, metal, or the like, and is formed on the gate insulation film 10 by CVD (Chemical Vapor Deposition) or the like.

The drain electrode 12, the source electrode 13, the back gate electrode 14, and the ground electrode 15 are constituted by a conductive film made of metal or the like, and are formed respectively on the drain region 7, the source region 8, the back gate region 9, and the isolation region 4 by CVD or the like.

The field insulation film 16 is constituted by, for example, a silicon oxide film. The field insulation film 16 covers, of the upper surface of the MOSFET 1, surfaces on which the gate insulation film 10, the gate electrode 11, the drain electrode 12, the source electrode 13, the back gate electrode 14, and the ground electrode 15 are not formed. The filed insulation film 16 is formed thicker than the gate insulation film.

In the MOSFET 1 having the above-described configuration, a first RESURF structure constituted by the p⁻ type first diffusion region 5, the n⁻ type epitaxial region 3, and the p⁻ type semiconductor substrate 2 is formed. Further, in the center of the MOSFET 1, a second RESURF structure constituted by the p⁻ type second diffusion region 6, the n⁻ type epitaxial region 3, and the p⁻ type semiconductor substrate 2 is formed. Therefore, the MOSFET 1 has a so-called double RESURF structure.

The epitaxial region 3 in the first RESURF structure and the second diffusion region 6 in the second RESURF structure are substantially depleted by grounding the ground electrode 15 and applying a voltage of equal to or greater than a predetermined level to between the gate electrode 11 and the drain electrode 12. Due to this, the potential is fixed and an electric field in the horizontal direction of FIG. 1 is desirably relaxed. As a result, effects such as improvement in the voltage withstandability can be obtained. The effect of improving the voltage withstandability is also achieved in a single RESURF structure. However, the MOSFET 1 including two RESURF structures is better in effect of improving the voltage withstandability than a case where it includes a single RESURF structure.

As explained above, in the MOSFET 1 according to the present embodiment, the central portion 6a which is formed relatively thicker is arranged right under the drain region 7. This makes the epitaxial region 3 right under the central portion 6a thinner, and makes the amount of electric charges possessed by the epitaxial region 3 right under the central portion 6a smaller than the amount of electric charges possessed by the epitaxial region 3 right under the peripheral portion 6b. In a conventional MOSFET, an electric charge balance is established by an electric field from an isolation region or the like. As compared with this, in the MOSFET 1 according to the present embodiment, an electric charge balance is established by an electric filed from the drain region 7 or the like by reducing the amount of electric charges.

For example, assume that the thickness of the central portion 6a is almost the same as that of the peripheral portion 6b and the thickness of the epitaxial region 3 right under the central portion 6a is almost the same as the thickness of the epitaxial region 3 right under the peripheral portion 6b. In this case, when the voltage level of the drain voltage changes to the ground level and the voltages of the gate, source, and back gate change to plus voltages, the electric charge balance near the drain region 7 is destroyed and a breakdown is caused at a relatively low drain voltage. However, the MOSFET 1 according to the present embodiment prevents the electric charge balance near the drain region 7 from being destroyed, by reducing the amount of electric charges possessed by the epitaxial region 3 right under the drain region 7. Therefore, in the MOSFET 1 according to the present embodiment, a breakdown is not caused at a relatively low voltage.

However, if the amount of electric charges is too small, the electric charge balance is destroyed when the voltage level of the drain voltage changes to a higher level in a plus direction with respect to the ground level, and a punch through occurs in the p$^-$ type semiconductor substrate 2 and p$^+$ type drain region 7. Hence, in the MOSFET 1 according to the present embodiment, the epitaxial region 3 right under the peripheral portion 6b is made relatively thick by making the peripheral portion 6b thinner than the central portion 6a, in order for the epitaxial region 3 to have an amount of electric charges which is sufficient for preventing occurrence of a punch through.

By keeping the balance of depth and concentration profile between the central portion 6a and the peripheral portion 6b or the balance of thickness or the like between the epitaxial region 3 under the central portion 6a and the epitaxial region 3 under the peripheral portion 6b, the MOSFET 1 according to the present embodiment can adapt to a situation in which the voltage level of the drain voltage changes from the ground level to a higher level in the plus direction. Therefore, the MOSFET 1 can have an excellent high voltage withstandability under the above-described situation, due to the effect of electric field relaxation by the RESURF structure.

Further, in the MOSFET 1 according to the present embodiment, the drain region 7 is formed at almost the center of the epitaxial region 3. For example, assume that the drain region is formed near the isolation region likewise a conventional MOSFET. In this case, the strength of an electric field between the drain region and the isolation region is raised due to that the voltage level of the drain voltage changes to a higher level, and a punch through or an undesirable breakdown might be caused. However, in the MOSFET 1, since the drain region 7 is apart from the isolation region 4, the strength of an electric field between the drain region 7 and the isolation region 4 is not raised unlike the conventional MOSFET, even if the voltage level of the drain voltage changes to a higher level. Therefore, a punch through or an undesirable breakdown is not easily caused.

As explained above, according to the present invention, it is possible to provide a semiconductor element having an excellent high voltage withstandability. Further, according to the present invention, it is possible to provide a semiconductor element in which a punch through or an undesirable breakdown is not easily caused, and a manufacturing method thereof.

The present invention is not limited to the above-described embodiment. For example, in the above-described embodiment, explanation has been made by employing as an example a case where each semiconductor region has an annular shape when seen from above the MOSFET 1. However, the present invention is not limited to this, but each semiconductor region may have a rectangular shape when seen from above the MOSFET 1.

Further, in the above-described embodiment, the epitaxial region 3 is formed by an epitaxial growth method. However, it may be formed by a lamination technique or the like.

Furthermore, the semiconductor element according to the above-described embodiment is not limited to a p-channel MOSFET, but may be an n-channel MOSFET. Further, in the above-described embodiment, explanation has been made by employing a case where the p-channel MOSFET 1 is formed by using the p-type semiconductor substrate 2. However, the present invention is not limited to this, but a reverse conductive type MOSFET may be formed by using an n-type semiconductor substrate.

This application is based on Japanese Patent Application No. 2002-123615 filed on Apr. 25, 2002, and the specification, claims, and drawings thereof are incorporated wherein in its entirety.

INDUSTRIAL APPLICABILITY

The present invention can be applied to a semiconductor element having a so-called RESURF structure and a manufacturing method thereof.

The invention claimed is:

1. A semiconductor element comprising: a first semiconductor region (2) of a first conductive type; a second semiconductor region (3) of a second conductive type which is formed on said first semiconductor region (2); a third semiconductor region (6) of a first conductive type which is formed in a predetermined surface area of said second semiconductor region (3); a fourth semiconductor region (7) of a first conductive type which is formed in a surface area of said third semiconductor region (6) and has a higher impurity concentration than said third semiconductor region (6) has; and a fifth semiconductor region (8) formed in a surface area of said second semiconductor region (3) so as to surround said third semiconductor region (6);

said third semiconductor region (6) having a central portion (6a) surrounding said fourth semiconductor region, and a peripheral portion (6b) surrounding said central portion (6a);

said central portion (6*a*) being formed to have a depth from a surface of said second semiconductor region (3) deeper than that of said peripheral portion (6*b*);

said second semiconductor region (3) arranged right under said central portion (6*a*) having a smaller amount of electric charges than an amount of electric charges of said second semiconductor region (3) arranged generally under said peripheral portion (6*b*), and said second semiconductor region (3) arranged generally under said central portion (6*a*) having a thickness thinner than that of said second semiconductor region (3) arranged generally under said peripheral portion (6*b*); and an isolation region (4) of a first conductive type which is formed at an outer edge of said second semiconductor region (3); and a sixth semiconductor region (5) formed in a surface area of said second semiconductor region (3) so as to contact said isolation region (4), wherein said second semiconductor region (3) which is present generally under said sixth semiconductor region (5) has a same thickness as that of said second semiconductor region (3) which is present generally under said peripheral portion (6*b*).

2. A semiconductor element comprising: a first semiconductor region (2) of a first conductive type; a second semiconductor region (3) of a second conductive type which is formed on said first semiconductor region (2); a third semiconductor region (6) of a first conductive type which is formed in a predetermined surface area of said second semiconductor region (3); a fourth semiconductor region (7) of a first conductive type which is formed in a surface area of said third semiconductor region (6) and has a higher impurity concentration than said third semiconductor region (6) has; and a fifth semiconductor region (8) formed in a surface area of said second semiconductor region (3) so as to surround said third semiconductor region (6);

said third semiconductor region (6) having a central portion (6*a*) surrounding said fourth semiconductor region, and a peripheral portion (6*b*) surrounding said central portion (6*a*);

said central portion (6*a*) being formed to have a depth from a surface of said second semiconductor region (3) deeper than that of said peripheral portion (6*b*);

said second semiconductor region (3) arranged right under said central portion (6*a*) having a smaller amount of electric charges than an amount of electric charges of said second semiconductor region (3) arranged generally under said peripheral portion (6*b*), and said second semiconductor region (3) arranged generally under said central portion (6*a*) having a thickness thinner than that of said second semiconductor region (3) arranged generally under said peripheral portion (6*b*); and said third semiconductor region (6) is formed at generally a center of a surface of said second semiconductor region (3), and said fourth semiconductor region (7) is formed at generally a center of a surface of said third semiconductor region (6).

3. A semiconductor element comprising: a first semiconductor region (2) of a first conductive type; a second semiconductor region (3) of a second conductive type which is formed on said first semiconductor region (2); a third semiconductor region (6) of a first conductive type which is formed in a predetermined surface area of said second semiconductor region (3); a fourth semiconductor region (7) of a first conductive type which is formed in a surface area of said third semiconductor region (6) and has a higher impurity concentration than said third semiconductor region (6) has; and a fifth semiconductor region (8) formed in a surface area of said second semiconductor region (3) so as to surround said third semiconductor region (6);

said third semiconductor region (6) having a central portion (6*a*) surrounding said fourth semiconductor region, and a peripheral portion (6*b*) surrounding said central portion (6*a*);

said central portion (6*a*) being formed to have a depth from a surface of said second semiconductor region (3) deeper than that of said peripheral portion (6*b*);

said second semiconductor region (3) arranged right under said central portion (6*a*) having a smaller amount of electric charges than an amount of electric charges of said second semiconductor region (3) arranged generally under said peripheral portion (6*b*), and said second semiconductor region (3) arranged generally under said central portion (6*a*) having a thickness thinner than that of said second semiconductor region (3) arranged generally under said peripheral portion (6*b*); and a ground electrode (15) which is formed on said isolation region (4), wherein said second semiconductor region (3) and said third semiconductor region (6) are substantially depleted when a voltage of a predetermined level is applied to between said gate electrode (11) and said drain electrode (12) and said ground electrode (15) is grounded.

4. A semiconductor element comprising: a first semiconductor region (2) of a first conductive type; a second semiconductor region (3) of a second conductive type which is formed on said first semiconductor region (2); a third semiconductor region (6) of a first conductive type which is formed in a predetermined surface area of said second semiconductor region (3); a fourth semiconductor region (7) of a first conductive type which is formed in a surface area of said third semiconductor region (6) and has a higher impurity concentration than said third semiconductor region (6) has; and a fifth semiconductor region (8) formed in a surface area of said second semiconductor region (3) so as to surround said third semiconductor region (6);

said third semiconductor region (6) having a central portion (6*a*) surrounding said fourth semiconductor region, and a peripheral portion (6*b*) surrounding said central portion (6*a*);

said central portion (6*a*) being formed to have a depth from a surface of said second semiconductor region (3) deeper than that of said peripheral portion (6*b*);

said second semiconductor region (3) arranged right under said central portion (6*a*) having a smaller amount of electric charges than an amount of electric charges of said second semiconductor region (3) arranged generally under said peripheral portion (6*b*), and said second semiconductor region (3) arranged generally under said central portion (6*a*) having a thickness thinner than that of said second semiconductor region (3) arranged generally under said peripheral portion (6*b*); and said second semiconductor region (3) generally under a central portion (6*a*) has such an amount of electric charges as to maintain an electric charge balance near said fourth semiconductor region (7) in a case where a voltage level of a voltage applied to said fourth semiconductor region (7) is at ground level; and said second semiconductor region (3) generally under said peripheral portion (6*b*) has such an amount of electric charges as to maintain an electric charge balance near said fourth semiconductor region (7) in a case where a voltage level of a voltage applied to said fourth semiconductor region (7) is a high level in a plus direction with respect to the ground level.

5. A manufacturing method of a semiconductor element comprising:

a step of forming a second semiconductor region (3) of a second conductive type on a semiconductor substrate (2) which constitutes a first semiconductor region of a first conductive type;

a step of forming in a surface area of said second semiconductor region (3), a third semiconductor region (6) of a first conductive type which includes a central portion (6*a*) and a peripheral portion (6*b*) having different depths from each other, wherein said central portion (6*a*) is formed in a predetermined surface area of said second semiconductor region (3), and said peripheral portion (6*b*) is formed in a surface area of said second semiconductor region (3) so as to abut on said central portion (6*a*) and surround said central portion (6*a*) and to have a depth shallower than the depth of said central portion (6*a*);

a step of forming a fourth semiconductor region (7) of a first conductive type having a higher impurity concentration than said third semiconductor region (6) has, in a surface region of said central portion (6*a*) included in said third semiconductor region (6); and forming an isolation region (4) of said first conductive type formed at an outer edge of said second semiconductor region (3); and a sixth semiconductor region (5) formed in said surface area of said second semiconductor region (3) so as to contact said isolation region (4), wherein said second semiconductor region (3) is present generally under said sixth semiconductor region (5) has a similar thickness as that of said second semiconductor region (3) which is present generally under said peripheral portion (6*b*).

\* \* \* \* \*